United States Patent [19]

Jones

[11] Patent Number: 5,272,186
[45] Date of Patent: Dec. 21, 1993

[54] CONCENTRATION OF FLUOROPOLYMER DISPERSIONS USING ACRYLIC POLYMERS OF HIGH ACID CONTENT

[75] Inventor: Clay W. Jones, Washington, W. Va.

[73] Assignee: E. I. Du Pont de Nemours and Company, Wilmington, Del.

[21] Appl. No.: 876,765

[22] Filed: May 1, 1992

[51] Int. Cl.$^5$ .................. C08F 6/20; C08L 27/18; C08L 27/20; C08L 33/02

[52] U.S. Cl. .................. 523/339; 523/335; 524/501; 528/486; 521/46; 525/199

[58] Field of Search .............. 524/501; 523/335, 339; 525/199; 528/486; 521/46

[56] References Cited

U.S. PATENT DOCUMENTS

| | | | |
|---|---|---|---|
| 2,478,229 | 8/1949 | Berry | 260/29.6 |
| 2,878,196 | 3/1959 | Buffington | 523/335 |
| 3,037,953 | 6/1962 | Marks et al. | 260/29.6 |
| 3,301,807 | 1/1967 | Hoashi | 260/29.6 |
| 3,704,272 | 11/1972 | Holmes | 260/29.6 |
| 3,752,796 | 8/1973 | Mueller et al. | 260/92.1 |
| 3,755,235 | 8/1973 | Sianesi et al. | 260/29.6 |
| 3,778,391 | 12/1973 | Morris et al. | 260/17.4 |
| 4,038,230 | 7/1977 | Mueller et al. | 260/29.6 |
| 4,145,502 | 3/1979 | Mueller et al. | 526/29.6 |
| 4,591,609 | 5/1986 | Kubo et al. | 523/336 |
| 4,601,919 | 7/1986 | Asami et al. | 427/126.3 |
| 4,775,713 | 10/1988 | Homma et al. | 524/517 |
| 4,970,258 | 11/1990 | Homma et al. | 524/504 |

OTHER PUBLICATIONS

Publication: Kolloid Zeitschrift 84, No. 1:63-74 (1938) by C. F. Vester entitled "Creaming of Hevea Latex with Colloids".

*Primary Examiner*—Veronica P. Hoke
*Assistant Examiner*—Andrew E. C. Merriam

[57] ABSTRACT

A process is disclosed for the concentration of aqueous fluoropolymer dispersion. Polyacrylic acid (or its salts) or an acrylic polymer of high acid content (or its salts) of average molecular weight between 50,000 and 500,000 is used as a concentrating agent and is added to the fluoropolymer dispersion.

10 Claims, 1 Drawing Sheet

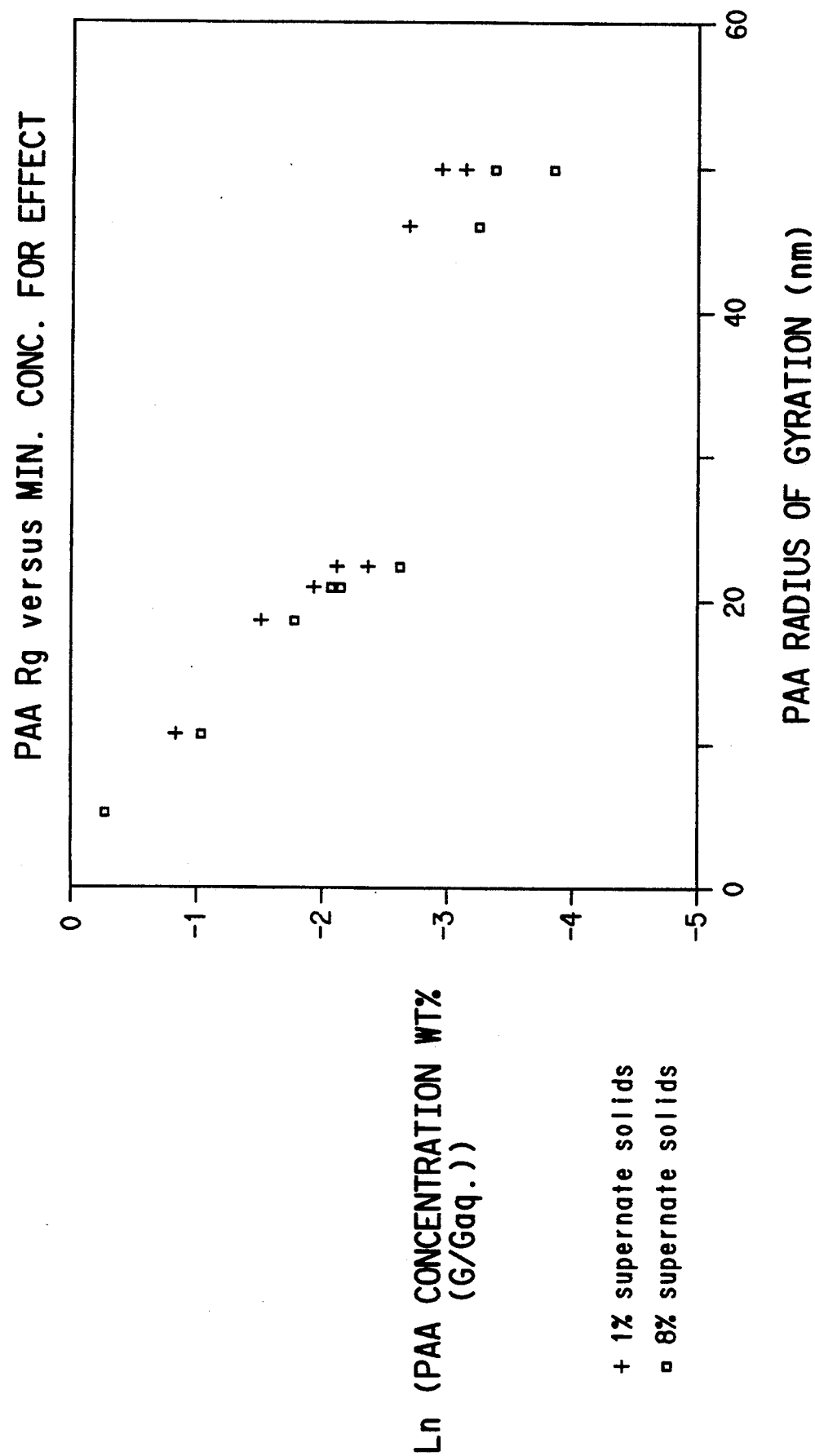

ized with optimum molecular weight, which minimizes the quantity of acrylic polymer required and, hence, the expense. The resulting concentrated polymer dispersion will then contain minimal residual concentrating agent, which will impart better color to films and coatings made from this dispersion.

CONCENTRATION OF FLUOROPOLYMER DISPERSIONS USING ACRYLIC POLYMERS OF HIGH ACID CONTENT

BACKGROUND OF THE INVENTION

This invention relates to a process for concentrating aqueous fluoropolymer dispersions, such as dispersions of polytetrafluoroethylene.

Concentrated fluoropolymer dispersions of higher weight percent than those obtained directly from polymerization are preferred in uses such as the coating of glass fabric, because fewer coatings are required to build the necessary thickness of fluoropolymer. Concentrated aqueous fluoropolymer dispersions are also preferred in uses such as the coating of metals and circuit boards. Such dispersions are also used to make films.

Various techniques are known for providing concentrated fluoropolymer dispersion, but all suffer from one or more disadvantages. Concentration of polytetrafluoroethylene dispersions to greater than 25 wt % is disclosed in U.S. Pat. No. 2,478,229. The action of naturally derived substances such as ammonium alginate, locust bean gum, gum tragacanth, and derivatives of cellulose to concentrate dispersions of perfluorohaloolefin polymers is disclosed in U.S. Pat. No. 2,878,196 to Buffington and U.S. Pat. No. 3,778,391 to Morris et al.

The concentration method which enjoys the widest commercial use is disclosed in U.S. Pat. Nos. 3,037,953; 3,301,807 and 3,704,272. The technique involves the addition of non-ionic surfactants such as ethoxylated alkyl phenols or ethoxylated aliphatic alcohols to a fluoropolymer dispersion obtained directly from polymerization. The resulting mixture is heated above its cloud point, which causes it to separate into upper and lower phases. The upper phase contains a significant portion of the non-ionic surfactant, making environmentally acceptable disposal of this phase expensive. The large amount of non-ionic surfactant needed, typically 3 wt % or greater based on polymer solids, is expensive. For some applications, the use of lower amounts of non-ionic surfactant would provide benefits to the end product, such as a more desirable color or ease of manufacture.

SUMMARY OF THE INVENTION

The present invention involves the discovery of a process which substantially overcomes the disadvantages discussed above. The pH of the dispersion obtained from polymerization is adjusted, if necessary, to a pH of about 6 or greater. Typically, a base such as ammonium hydroxide is used. To this mixture is added an acrylic polymer concentrating agent having an acid content of 20% or more by weight and a weight-average molecular weight of about 50,000 to about 500,000, in an amount from about 0.01 wt % to about 0.5 wt %, based on the weight of the aqueous portion of the dispersion. A phase separation occurs, and a concentrated dispersion of 50 to 70 wt % is formed as a lower phase. To lower the viscosity and enhance the stability of the lower, concentrated phase, either an ionic or non-ionic surfactant can be added before the addition of the acrylic polymer. Further ionic or non-ionic surfactant can be added to the concentrated phase to adjust viscosity or to provide even more stability.

The process of the present invention provides several advantages. First, the acrylic polymer concentrating agent such as polyacrylic acid is easily obtained or synthesized with optimum molecular weight, which minimizes the quantity of acrylic polymer required and, hence, the expense. The resulting concentrated polymer dispersion will then contain minimal residual concentrating agent, which will impart better color to films and coatings made from this dispersion.

Second, the amount of organic materials left in the upper phase, which is discarded, can be minimized, allowing for greater ease and lower cost of disposal. The cost of the stabilizing agent, for example, the non-ionic surfactant, is reduced in comparison to the amount required by prior art methods, because very little is wasted. There is a greater versatility in the choice of a stabilizing agent, because the cloud point is no longer the primary consideration for choosing it. The amount of organic materials in the concentrated phase can be reduced to the minimum amount needed for stabilization and viscosity-control, in comparison to the relatively large amount needed for cloud point separation.

Finally, since the process is relatively insensitive to temperature, the capital expenditure for separation equipment can be reduced.

BRIEF DESCRIPTION OF THE DRAWING

The drawing consists of one FIGURE which is a graph showing the relationship between the natural logarithm of polyacrylic acid (PAA) concentration and the radius of gyration of the PAA.

DETAILED DESCRIPTION OF THE INVENTION

The polymer of the fluoropolymer dispersions of this invention can be homopolymer, copolymer, terpolymer or tetrapolymer made from an ethylenically unsaturated monomer containing at least one fluorine atom. If the polymer is other than a homopolymer, the monomer can be polymerized with other copolymerizable ethylenically unsaturated monomers, such that the product from polymerization consists of a dispersion of colloidal particles which are water insoluble. Examples of suitable polymers include polytetrafluoroethylene (PTFE), copolymers of tetrafluoroethylene (TFE) and perfluoro(propyl vinyl) ether (PPVE) and copolymers of TFE and hexafluoropropylene (HFP).

Synthetic acrylic polymers of acid content of 20% or more by weight can be used as the concentrating agent in the present invention. The preferred acrylic polymer is polyacrylic acid (PAA). The acrylic polymers comprise polymers made with acrylic monomers such as, but not limited to, ethyl acrylate, methyl methacrylate, acrylic acid, and methacrylic acid, and/or styrene monomers such as, but not limited to, styrene, alpha-methyl styrene, and p-methyl styrene, such that the acid functionality introduced by carboxylic acid-containing monomers is 20% or more by weight, calculated on the basis of acrylic acid. The synthetic acrylic polymers can be synthesized using various monomers and initiators. For example, an acrylic terpolymer of 63% acid can be made by combining 2.2 g methyl methacrylate, 1.8 g ethyl acrylate, 6 g of methacrylic acid, and 0.044 g of 2,2'-azobis(2-methylbutanenitrile) in a closed test tube and heating to 80° C. for several hours. The polymer obtained is an acrylic polymer having 60% acid by weight and a weight average molecular weight of 180,000.

The pH of the dispersion obtained from polymerization is adjusted, if necessary, to a pH of about 6 or greater. Typically, a base such as ammonium hydroxide is used. To this mixture is added an acrylic polymer concentrating agent having an acid content of 20% or more by weight and a weight-average molecular weight of about 50,000 to about 500,000, in an amount from about 0.01 wt % to about 0.5 wt %, based on the weight of the aqueous portion of the dispersion.

The preferred conditions for concentrating the fluoropolymer dispersion depend both on the molecular weight of the acrylic polymer used and on the particle size of the fluoropolymer dispersion to be concentrated. For example, if polyacrylic acid of molecular weight 435,000 is used, only 0.05 wt % PAA (based on the weight of the aqueous phase of the mixture of dispersion, base, and other added ingredients) is necessary to effect the concentration of a PTFE dispersion of 40 wt % solids and particle size 250 nm. The resulting lower, concentrated phase is 65 wt % solids, based on the total weight of the lower phase, and the upper phase is 1 wt % solids. If, however, PAA of approximately molecular weight 90,000 is used, 0.265 wt % is required. The resulting concentrated phase is 57 wt %, and the upper phase is 1 wt % solids. If a dispersion of particles of a copolymer of about 98.5 mol % tetrafluoroethylene (TFE) and about 1.5 mol % PPVE, having 20 wt % solids and particle size of 150 nm is used with PAA of molecular weight 435,000, 0.17 wt % of PAA is required to obtain a concentrated phase of 44 wt % solids and an upper phase of 0.6 wt % solids.

Polymer solids content can be measured by heating a weighed sample of either the upper or lower phase of the concentrated polymer dispersion at 100° C. to 125° C. for 1½ hours in air, then at 380° C. for fifteen minutes in an inert atmosphere such as argon or nitrogen, allowing to cool, and then re-weighing. The weight of solids remaining, divided by the original weight and multiplied by 100, gives polymer solids content in weight percent.

Surprisingly, there is an almost linear relationship between the natural logarithm of the minimum concentration of PAA (expressed in wt %) needed to effect a concentration of fluoropolymer dispersion and the calculated radius of gyration (Rg) of PAA (in nanometers). This relationship is shown in the Drawing. Two sets of data are plotted. One set (indicated by squares) represents the use of concentrations of PAA needed to effect a concentration in which there were 8 wt % solids in the supernate, and the other set (indicated by crosses) represents the use of concentrations of PAA needed to effect a concentration in which there were 1 wt % solids in the supernate.

The Drawing shows a relationship between the concentration of PAA of various molecular weights required to achieve a specified concentrating effect and the calculated size of the PAA molecule in solution. The concentrating effect of the PAA was measured by determining the percent solids of the supernate once the concentration process was complete. The test for concentrating effect was conducted by first adding (1) from 5 to 20 g of a 40% polymer solids PTFE dispersion having average particle size of 250 nm and (2) 0 to 15 g of demineralized water into a test tube such that the weight of the diluted or undiluted dispersion was 20 g. Next was added 0.45 g of concentrated ammonium hydroxide. Finally was added from 0.5 to 5 g of a PAA solution which could contain from 0.1 to 1 g of PAA and 4 drops of concentrated ammonium hydroxide in 25 ml of demineralized water. The concentration of PAA in the final mixture was calculated based on the weight (in grams) of PAA added divided by the weight (in grams) of water in the final mixture. From 4 to 8 test tubes were prepared with various concentrations of PAA. The test tubes were stoppered, and the contents were thoroughly mixed by inverting several times. The test tubes containing the mixtures were placed in a constant temperature bath at 50° C. The concentration was allowed to proceed overnight. The following morning the percent solids in the supernate was determined by evaporation of the water from a weighed sample of 2 to 5 g of the supernate held at 150° C. for 2 hours or more. The sample was heated at 380° C. for 15 minutes, allowed to cool and then reweighed. The percent polymer solids is then the weight of polymer remaining divided by the weight of the original sample of supernate. The concentration of PAA necessary to achieve either 1 percent or 8 percent supernate solids was then determined by extrapolation from the values of solids actually obtained. These are the values plotted on a natural logarithmic scale in the ordinate.

The calculation of the radius of gyration is based upon an equation in the Polymer Handbook 1st edition, 1966, pp. IV-4 and IV-52. The radius in solution is a function of the square root of the molecular weight. The molecular weights of the various PAA samples were determined either by intrinsic viscosity or, for samples of molecular weight below 100,000, the manufacturer's reported value. For PAA the equation $$\frac{R_g}{\sqrt{M}} \times 1000 = 756$$

gives the radius, $R_g$, in Angstroms. These are the values plotted on the abscissa.

Although the lower phase of the concentrated dispersion tends to be viscous and subject to agglomeration by shearing forces, its viscosity can be lowered, and the sensitivity to shear reduced, by adding of a small amount of a non-ionic or ionic surfactant before concentration. Generally, 0.05 to 12 wt % (based on the weight of polymer solids) of a non-ionic surfactant such as an ethoxylated alkyl phenol, an ionic surfactant such as an alkyl sulfate, or a polyalcohol such as ethylene glycol, serves this purpose. To increase the stability further and to adjust the surface tension of the concentrated dispersion so that it will wet substrates such as glass cloth, 1 to 12 wt % of a non-ionic surfactant can be added.

Weight percent acid can be determined by dissolving a weighed sample of the acrylic polymer in a mixture of acetone and water and titrating with a standardized sodium hydroxide solution to a phenolphthalein endpoint. Percent acid can be calculated by the following equation, assuming that acrylic acid provided the acid functionality:

Wt % acid = volume of titrant in liters × normality of titrant × 7200/sample weight in grams.

To determine the wt % acid for a salt of an acrylic polymer, the salt can be dissolved in water and acidified using a mineral acid. A water immiscible solvent such as ethyl ether can be used to perform multiple extractions, or a liquid-liquid extraction apparatus can be used. The extract can be dried using anhydrous magnesium sulfate, after which it is filtered and the solvent evaporated leaving the acrylic polymer. Weight percent acid can be calculated as previously described.

The average molecular weight of those acrylic polymers of high acid functionality which dissolve in tetrahydrofuran can be determined by gel permeation chromatography (GPC). A Hewlett Packard 109M Liquid Chromatograph configured with workstation and computer software package for GPC can be employed. Microstyragel Gel Permeation Columns from the Waters Division of Millipore Corporation can be used and can be calibrated using polystyrene standards available from Millipore Corporation. Those acrylic polymers which are insoluble in tetrahydrofuran, but soluble in water can be characterized by intrinsic viscosity. Polymer samples can be dissolved in 0.1N sodium bromide solution at various concentrations and the viscosity measured by means of the rate of flow through a glass capillary maintained at 25° C. The intrinsic viscosity is obtained by extrapolation to the viscosity at infinite dilution. Under these conditions, average molecular weight of PAA can be obtained by the following equation:

$$\text{intrinsic viscosity} = K \times (\text{average molecular weight})^a$$

where
$K = 31.2 \times 10^{-3}$ ml/g, and
$a = 0.755$.

Acrylic polymers other than PAA require different values of K and a, which can be obtained using the method described by Noda et al. in J. Phys. Chem., 74, 710 (1970).

EXAMPLES

The invention is further described by the following illustrative, nonlimiting examples:

EXAMPLE 1

In this example, a starting aqueous dispersion of PTFE particles contained 40 wt % polymer solids, and the average particle size was about 250 nm. PAA of average molecular weight 435,000 was used as the concentrating agent. A solution of 0.2 g PAA with 4 drops of ammonium hydroxide in 25 ml of water was prepared. Into a test tube were measured 20 g of dispersion, 1 g of a solution of 0.225 g of the nonionic surfactant sold by Servo BV (Delden, The Netherlands) under the trademark Serdox ® NBS 6,6 in 25 ml of water, 1 g of the PAA solution, and 0.45 g of concentrated ammonium hydroxide. The contents of the test tube were mixed by inverting the tube several times. The test tube was placed into a water bath held at 65° C. After four hours, the concentration was nearly complete. The concentrated lower phase was found to have 63.2 wt % solids, and the upper phase was found to have 0.76 wt % solids.

EXAMPLE 2

In this example, a starting aqueous dispersion of PTFE particles contained 45.5 wt % polymer solids, and the average particle size was 250 nm. PAA of average molecular weight 435,000 was used as the concentrating agent. A solution of 8.5 g of PAA and 6.8 g of concentrated ammonium hydroxide in 1 liter of water was prepared. To a 10 gal vessel equipped with an agitator were added 20 pounds of the aqueous PTFE dispersion, 254 g of concentrated ammonium hydroxide and 1 liter of the PAA solution. The mixture was stirred for a few minutes to effect mixing, and then stirring was stopped. The mixture was heated to 51° C. over the course of one hour and held above 40° C. for an additional two hours. The mixture was allowed to cool and stand overnight. The concentrated phase was found to have 61 wt % solids, and the upper phase 0.4 wt % solids.

EXAMPLE 3

In this example, a starting aqueous dispersion of particles of a copolymer of TFE and PPVE contained 19.7 wt % polymer solids, and the average particle size was about 145 nm. PAA of average molecular weight 435,000 was used as the concentrating agent. A solution of 0.2 g PAA with 4 drops of ammonium hydroxide in 25 ml of water was prepared. In a test tube was placed 20 g of the polymer dispersion, 1 g of a solution of 0.225 g of Serdox ® NBS in 25 ml of water, 3 g of the polyacrylic acid solution, and 0.45 g of concentrated ammonium hydroxide. The contents of the test tube were mixed by inverting the tube several times. The test tube was placed in a water-ice bath. After three hours the separation was nearly complete. The concentrated lower phase was found to have 48 wt % solids, and the upper phase 1.6 wt % solids.

EXAMPLE 4

In this example, a starting aqueous dispersion of PTFE particles contained 40 wt % polymer solids, and the average particle size was about 250 nm. Sodium polyacrylate of average molecular weight 60,000 (Fluka) was used as the concentrating agent. A solution of 0.25 g sodium polyacrylate in 25 ml of water was prepared. In a test tube were placed 20 g of the polymer dispersion, 5 g of the sodium polyacrylate solution, and 0.45 g ammonium hydroxide. The contents of the test tube were mixed by inverting the tube several times. The test tube was placed in a water bath maintained at 50° C. The concentration was nearly complete after 3 hours. The concentrated lower phase was found to have 58 wt % solids, and the upper phase 0.93 wt % solids.

EXAMPLE 5

In this example, a starting aqueous dispersion of PTFE particles contained 40 wt % polymer solids, and the average particle size was about 250 nm. To 20 g of this PTFE dispersion were added 0.45 grams of concentrated ammonium hydroxide and 2 grams of a solution of (1) an acrylic polymer composed of methyl methacrylate, ethyl acrylate, and methacrylic acid found to have 60.8 wt % acid and an average molecular weight of 180,000 and (2) 0.8 grams of concentrated ammonium hydroxide in 25 ml of water. The mixture was maintained at 50° C. for several hours and then allowed to stand overnight. The concentrated lower phase was found to have 65.9 wt % solids, and the upper phase 0.28 wt % solids.

What is claimed is:
1. A process for concentrating aqueous fluoropolymer dispersions, which process comprises
   a) providing a fluoropolymer dispersion having pH of about 6 or greater;
   b) adding to the dispersion at least one concentrating agent selected from the group consisting of polyacrylic acid, a polyacrylate salt, an acrylic polymer of 20 wt % acid content or more, and a salt of an acrylic polymer of 20 wt % acid content or more, said concentrating agent having a weight average molecular weight from about 50,000 to about 500,000, in an amount such that the resulting mixture contains 0.01 to 0.5 weight percent of the concentrating agent based on the aqueous content of the mixture;

c) allowing concentration to proceed, whereby an upper and a lower phase are obtained; and d) separating the upper and the lower phases.

2. The process of claim 1 wherein the fluoropolymer is a homopolymer, copolymer, terpolymer or tetrapolymer comprising an ethylenically unsaturated monomer containing at least one fluorine atom.

3. The process of claim 2 wherein the fluoropolymer comprises tetrafluoroethylene.

4. The process of claim 3 wherein the fluoropolymer is polytetrafluoroethylene or tetrafluoroethylene/perfluoro(propyl vinyl) ether copolymer or fluoroethylene/hexafluoropropylene copolymer.

5. The process of claim 4 wherein the fluoropolymer is polytetrafluoroethylene.

6. The process of claim 5 wherein the concentrating agent is polyacrylic acid.

7. The process of claim 1 further comprising adding to the dispersion, before or with the concentrating agent, a stabilizing agent selected from the group consisting of non-ionic surfactants, ionic surfactants, polyalcohols, and mixtures thereof, such that the dispersion contains 0.05 to 12 wt % of the stabilizing agent, based on the polymer solids content of the resulting mixture.

8. The process of claim 1 further comprising a step (e) wherein a non-ionic or ionic surfactant is added to the lower phase of step (d) in an amount equal to about 1 to about 12 weight percent based on the aqueous content of the lower phase.

9. The process of claim 8 wherein said surfactant present in said lower phase is present solely by addition to said lower phase.

10. The process of claim 1 followed by making a coating or film from said lower phase.

* * * * *